US007162403B2

(12) United States Patent
Nouri et al.

(10) Patent No.: US 7,162,403 B2
(45) Date of Patent: Jan. 9, 2007

(54) SYSTEM AND METHOD FOR EFFICIENTLY TRACING SIMULATION DATA IN HARDWARE ACCELERATION SIMULATION SYSTEMS

(75) Inventors: Nasser Nouri, San Jose, CA (US);
Ping-Chih Wu, Cupertino, CA (US);
Mohamed Soufi, Santa Clara, CA (US);
David S. Allison, San Ramon, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 715 days.

(21) Appl. No.: 10/366,859

(22) Filed: Feb. 14, 2003

(65) Prior Publication Data

US 2004/0162717 A1 Aug. 19, 2004

(51) Int. Cl.
*G06F 17/50* (2006.01)
(52) U.S. Cl. ............................................ 703/14; 716/5
(58) Field of Classification Search ............ 703/14–17; 716/4–6; 714/741
See application file for complete search history.

(56) References Cited

U.S. PATENT DOCUMENTS

| 5,327,361 | A | * | 7/1994 | Long et al. | .................. 703/15 |
| 6,336,087 | B1 | * | 1/2002 | Burgun et al. | ................ 703/15 |
| 6,510,405 | B1 | * | 1/2003 | Gilbertson | ................... 703/16 |
| 6,810,507 | B1 | * | 10/2004 | Biswal | ......................... 716/4 |

* cited by examiner

*Primary Examiner*—Albert W. Paladini
(74) *Attorney, Agent, or Firm*—Osha Liang LLP

(57) ABSTRACT

A system for tracing signals for a cycle-based simulation includes a traced signal and a system resources availability information of the cycle-based simulation, a runtime compiler configured to use the system resources availability information to assign a system resource to trace the traced signal, a logic design used with the system resources availability information to generate a simulation image, a first value of the traced signal generated by execution of a simulation image, and a traced signal buffer configured to store the first value and upload the first value.

21 Claims, 13 Drawing Sheets

SYSTEM AND METHOD FOR EFFICIENTLY TRACING SIMULATION DATA IN HARDWARE ACCELERATION SIMULATION SYSTEMS

BACKGROUND OF INVENTION

Simulation systems are often used for verification and debugging of logic designs. Simulation systems for logic design verification are typically either event-driven or cycle-based. FIG. 1 shows components of a typical cycle-based simulation system for verification of logic designs. A logic design (20) is compiled by a compiler (22) residing on a host computer (24), thereby generating a simulation image file (26), which includes executable code. The logic design may be written in a Hardware Definition Language (HDL), such as Verilog or Very-High-Speed-Integrated-Circuit Hardware Description Language (VHDL). The simulation image file (26) is executed on a simulation system (28). The simulation system (28) may be hardware accelerated and may use multiple processors running in parallel.

One of the most commonly used methods in logic design verification is signal tracing. Signal tracing involves periodically saving values of particular signals of the simulation during runtime. The values of such signals of the logic design at certain times may be of interest to a designer. For example, the designer may wish to examine signal values at the output of a particular NAND gate at particular times/cycles. Typically, the saved signal values are viewed by the designer using a commercial waveform display tool, e.g., SignalScan™, a trademark of Cadence Design Systems, Inc. Thus, by analysis of the saved signal values, the logic design may be debugged.

Two common methods of signal tracing are compile-time tracing and runtime tracing. With compile-time tracing, signals are defined statically by the compiler (22) during compilation of the logic design (20). FIG. 2 shows components of a simulation system using compile-time tracing. The compiler (22) takes inputs from the logic design (20) and tracing information (40). The tracing information (40) includes instructions determining which signals are traced, how to save values of the traced signals, and for what times the signals are traced. The compiler (22) compiles the logic design (20) and the tracing information (40) to generate a simulation image (42), which includes tracing instructions (44). An exemplary size of the simulation image (42) is 10 Megabytes, of which 2 Megabytes is accounted for by the tracing instructions (44).

The simulator (28) executes the simulation image (42) and uploads traced signal information from a traced signal buffer (46) to the host computer (24). The traced signal buffer (46) is a location where the values of traced signals may be stored. The traced signal buffer (46) may be a two-dimensional array, which is created by the compiler (22).

FIG. 3 shows a flowchart for using the simulator of FIG. 2 for a cycle-based simulation using compile-time tracing. A first step of the flowchart includes generating the logic design (Step 70). The logic design may be written in an HDL, such as Verilog. The tracing information for the logic design is generated (Step 72), and the compiler compiles the tracing information and the logic design, thereby generating the simulation image (Step 74). Once generated, the simulation image is loaded onto the simulator (Step 76), and the simulator simulates the logic design and traces the signals for the current cycle (Step 78).

When the current simulation cycle has ended, a determination is made as to whether the simulation (as a whole) has ended (Step 80). If the simulation has ended, the traced signal data is uploaded from the traced signal buffer on the simulator to the host computer (Step 82). Otherwise, if the simulation has not ended, a determination is made as to whether the traced signal buffer is full (Step 84). If the tracing buffer is not full, the simulation advances to the next cycle (Step 90), and the simulation resumes, with the simulation simulating the logic design and tracing signals (Step 78). Otherwise, if the traced signal buffer is full, the simulation is halted (Step 86), and data from the traced signal buffer is uploaded to the host computer (Step 88).

Once data from the traced signal buffer has been uploaded, the simulation advances to the next cycle (Step 90), and the simulation resumes, with the simulation simulating the logic design and tracing signals (Step 78). The simulation continues until the determination at Step 80 indicates that the simulation has ended. If, after the simulation has ended, a user desires to change which signals are traced, Step 72 is repeated, and the simulation begins again.

With runtime tracing, which typically occurs with single-step simulation, signals to be traced during simulation may be defined dynamically by a user of the simulator. FIG. 4 shows components of a simulator using runtime tracing. A compiler (110) takes input from the logic design (20). The compiler (110) compiles the logic design (20) to generate a simulation image (112). An exemplary size of the simulation image (112) is 8 Megabytes. A simulator (114) executes the simulation image (112) and uploads traced signal data (116) to the host computer. A tracing configuration file (118) facilitates input and alteration of tracing information to the simulator. The tracing configuration file (118) includes instructions determining which signals are traced, how to save values of the traced signals, and for what times the signals are traced.

FIG. 5 shows a flowchart for using the simulator of FIG. 4 for a single-step, cycle-based simulation using runtime tracing. A first step of the flowchart includes generating the logic design (Step 140). Once the logic design is generated, the compiler compiles the logic design, thereby generating the simulation image (Step 142). Once generated, the simulation image is loaded onto the simulator (Step 144), and a determination is made as to whether executing the simulation requires tracing signals during the current cycle (Step 146). The tracing configuration file is consulted by the simulator in order to determine whether signals are traced during execution of the current cycle of the simulation.

If signals are not required to be traced during the current cycle, then the simulation is executed on the simulator (Step 148). Otherwise, if signals are required to be traced, then tracing information is obtained (Step 150). Tracing information may be obtained from the tracing configuration file via the host computer. The tracing information may also be obtained from a user of the simulator via a user interface, or other mechanism.

Once the tracing information (if required), is obtained, then the simulation is executed on the simulator and signals are traced (Step 148). After the current cycle has been simulated, a determination is made as to whether tracing information was obtained (Step 152). If signal information was obtained for the current cycle, then signals are traced using the tracing information (Step 154). The tracing information is used to determine which signals are traced. Then, the simulation is halted (Step 156), and traced signal data from the current cycle is uploaded to the host computer (Step 158). The time required for halting the simulation and uploading the saved signal tracing data to the host computer varies with various simulator implementations. For example, halting the simulation and uploading the saved signal tracing data may require 500 milliseconds (ms).

Once the traced signal data from the current cycle is uploaded to the host computer, or, if tracing information was not obtained, as determined in Step 152, the current cycle is advanced (Step 160). A determination is then made as to whether the simulation has ended (Step 162). If the simulation has not ended, Steps 146–162 are repeated until the simulation ends.

Those skilled in the art will appreciate that implementation of, and aspects of, the compile-time tracing and runtime tracing simulators as shown in FIGS. 2–5 may vary according to implementation. For example, although an estimate of 2 MB was given as the amount space that the tracing information adds to the simulation image for compile-time tracing, the amount added to the simulation image by the tracing information may be larger or smaller, according to implementation. Additionally, although an estimate of 500 ms was given for runtime tracing as the amount of time required for uploading saved signal tracing information to the host computer for a simulation cycle, the time added to a runtime tracing simulation for uploading may vary with implementation.

SUMMARY OF INVENTION

In general, in one aspect, the invention relates to a system for tracing signals for a cycle-based simulation. The system comprises a traced signal and a system resources availability information of the cycle-based simulation, and a runtime compiler configured to use the system resources availability information to assign a system resource to trace the traced signal.

In general, in one aspect, the invention relates to a system for tracing signals for a cycle-based simulation. The system comprises a traced signal and a system resources availability information of the cycle-based simulation, a runtime compiler configured to use the system resources availability information to assign a system resource to trace the traced signal, a logic design used with the system resources availability information to generate a simulation image, a first value of the traced signal generated by execution of a simulation image; and a traced signal buffer configured to store the first value and upload the first value.

In general, in one aspect, the invention relates to a method of tracing signals for a cycle-based simulation. The method comprises designating a traced signal using a tracing information, assigning a system resource to the traced signal if the system resource is available, performing a first simulation cycle of the cycle-based simulation to generate a first value of the traced signal, and tracing the traced signal using the first value and the system resource.

In general, in one aspect, the invention relates to a computer system for tracing signals for a cycle-based simulation. The computer system comprises a processor, a memory, a storage device, and software instructions. The software instructions are stored in the memory for enabling the computer system to perform designating a traced signal using a tracing information, assigning a system resource to the traced signal if the system resource is available, performing a first simulation cycle of the cycle-based simulation to generate a first value of the traced signal, and tracing the traced signal using the first value and the system resource.

In general, in one aspect, the invention relates to an apparatus for tracing signals for a cycle-based simulation. The apparatus comprises means for designating a traced signal using a tracing information, means for assigning a system resource to the traced signal if the system resource is available, means for performing a first simulation cycle of the cycle-based simulation to generate a first value of the traced signal, and means for tracing the traced signal using the first value and the system resource.

Other aspects and advantages of the invention will be apparent from the following description and the appended claims.

DETAILED DESCRIPTION

Figure 1:
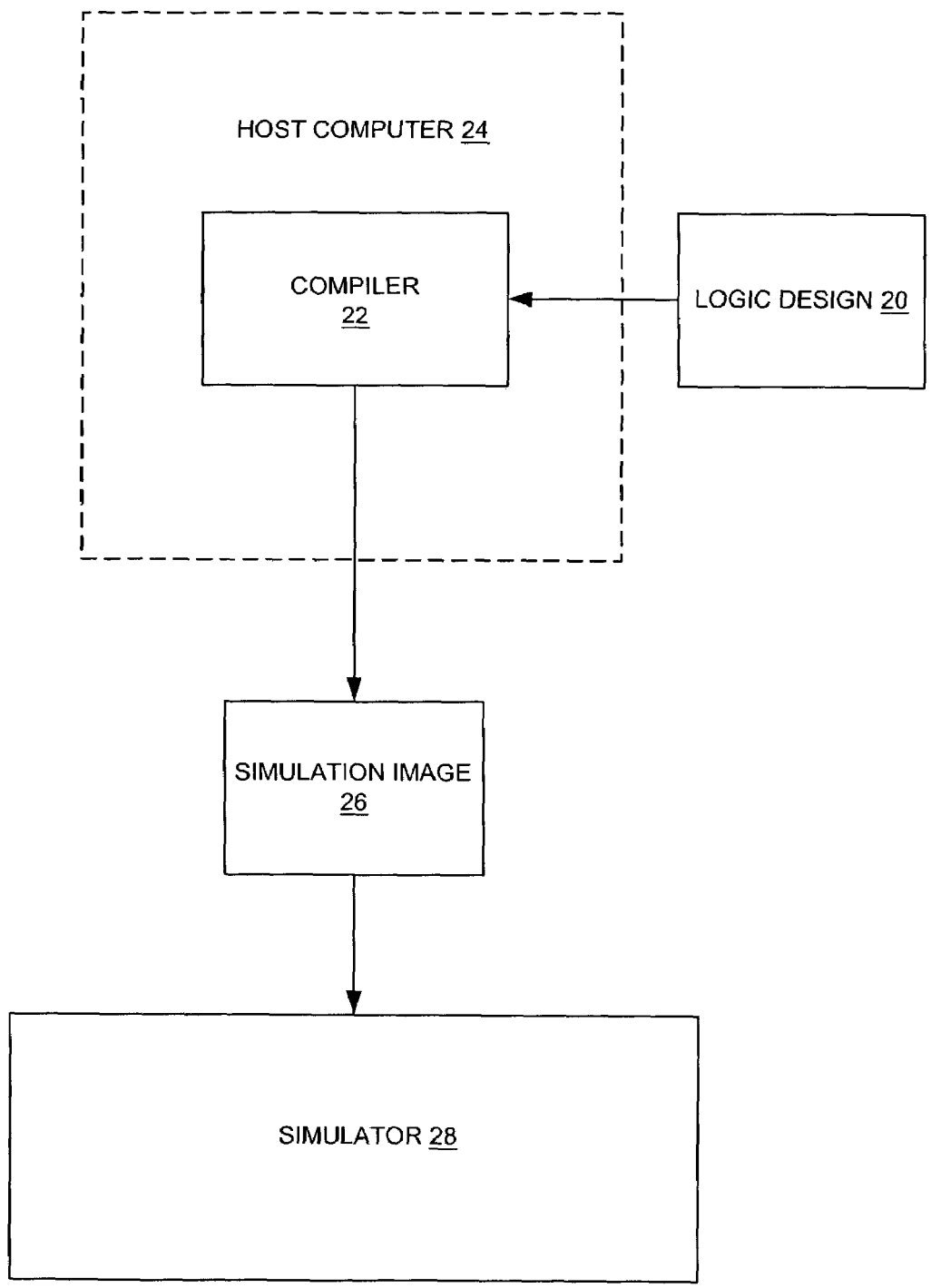
FIG. 1 shows components of a typical cycle-based simulation system for verification of logic designs.
Figure 2:
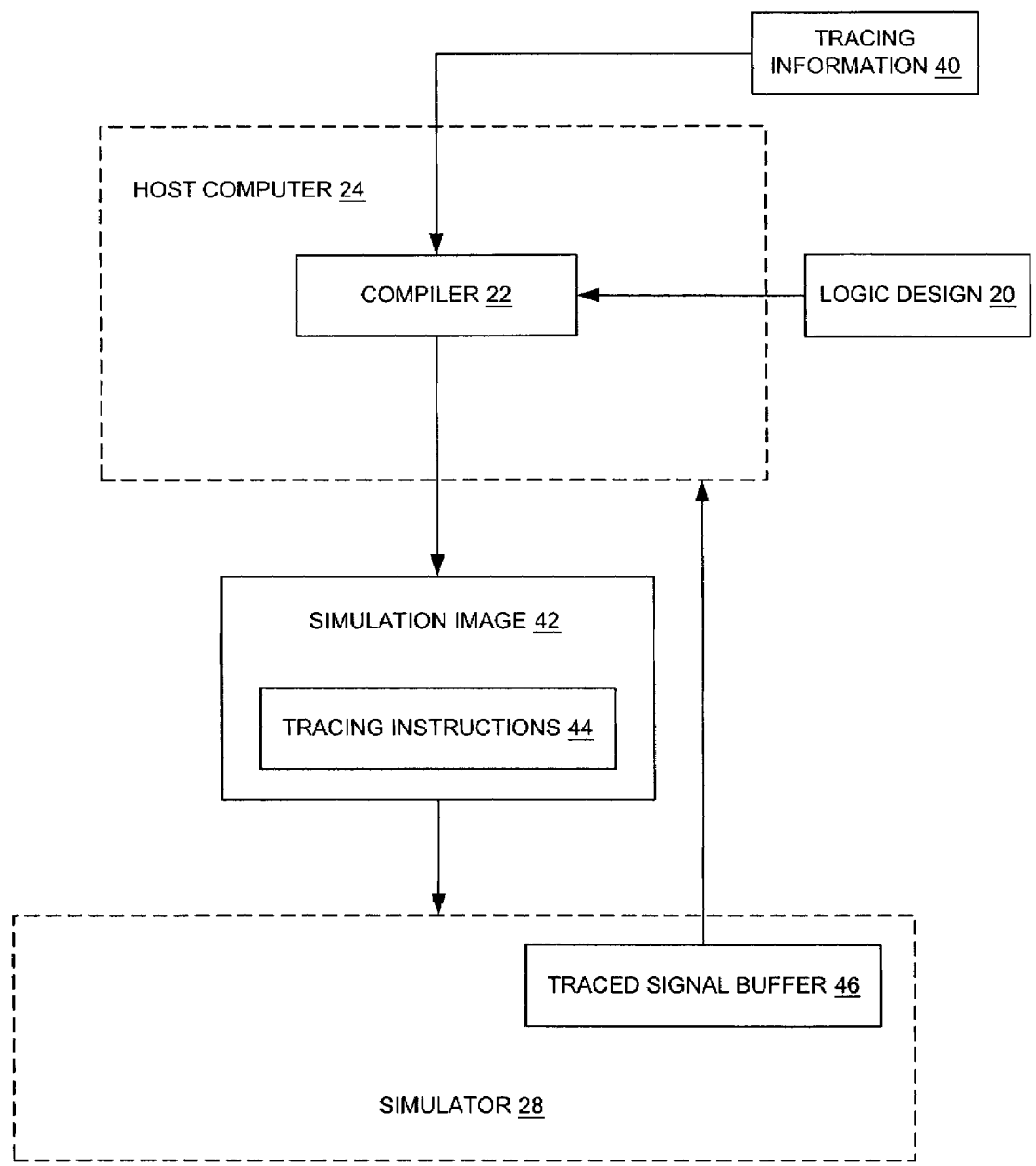
FIG. 2 shows components of a simulation system using compile-time tracing.
Figure 3:
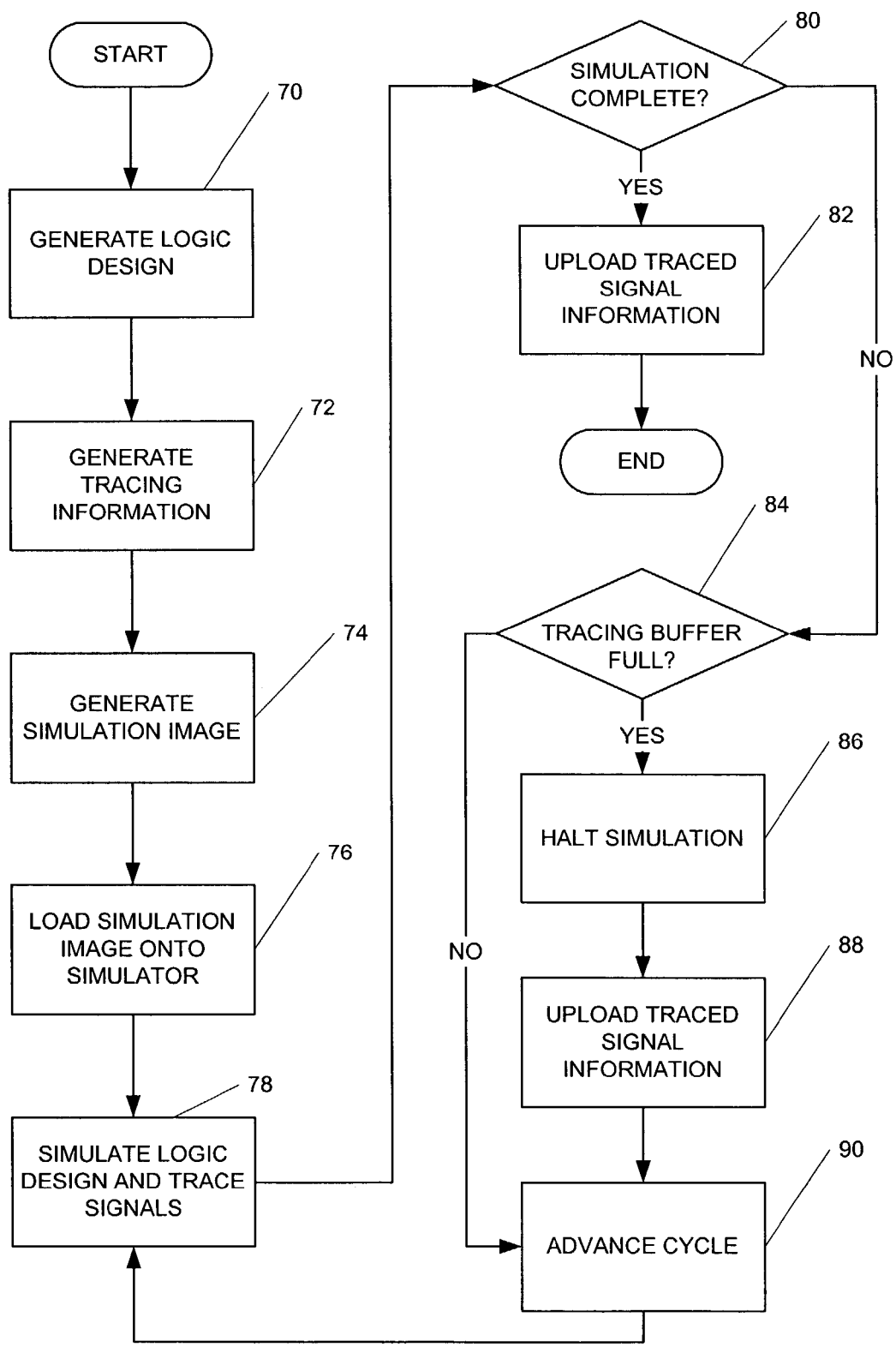
FIG. 3 shows a flowchart for using a simulator for a cycle-based simulation using compile-time tracing.
Figure 4:
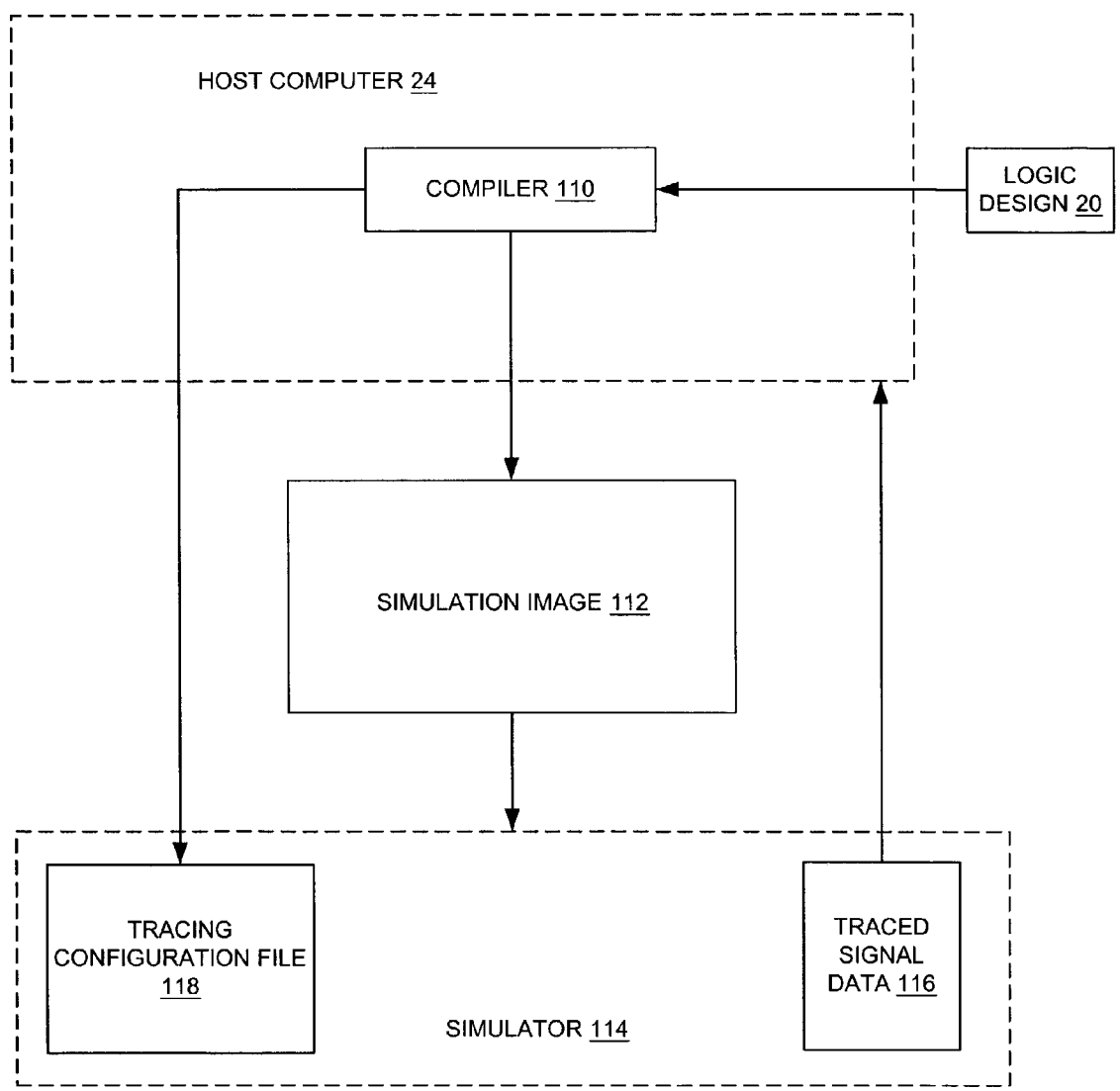
FIG. 4 shows components of a simulator for a cycle-based simulation using runtime tracing.
Figure 5:
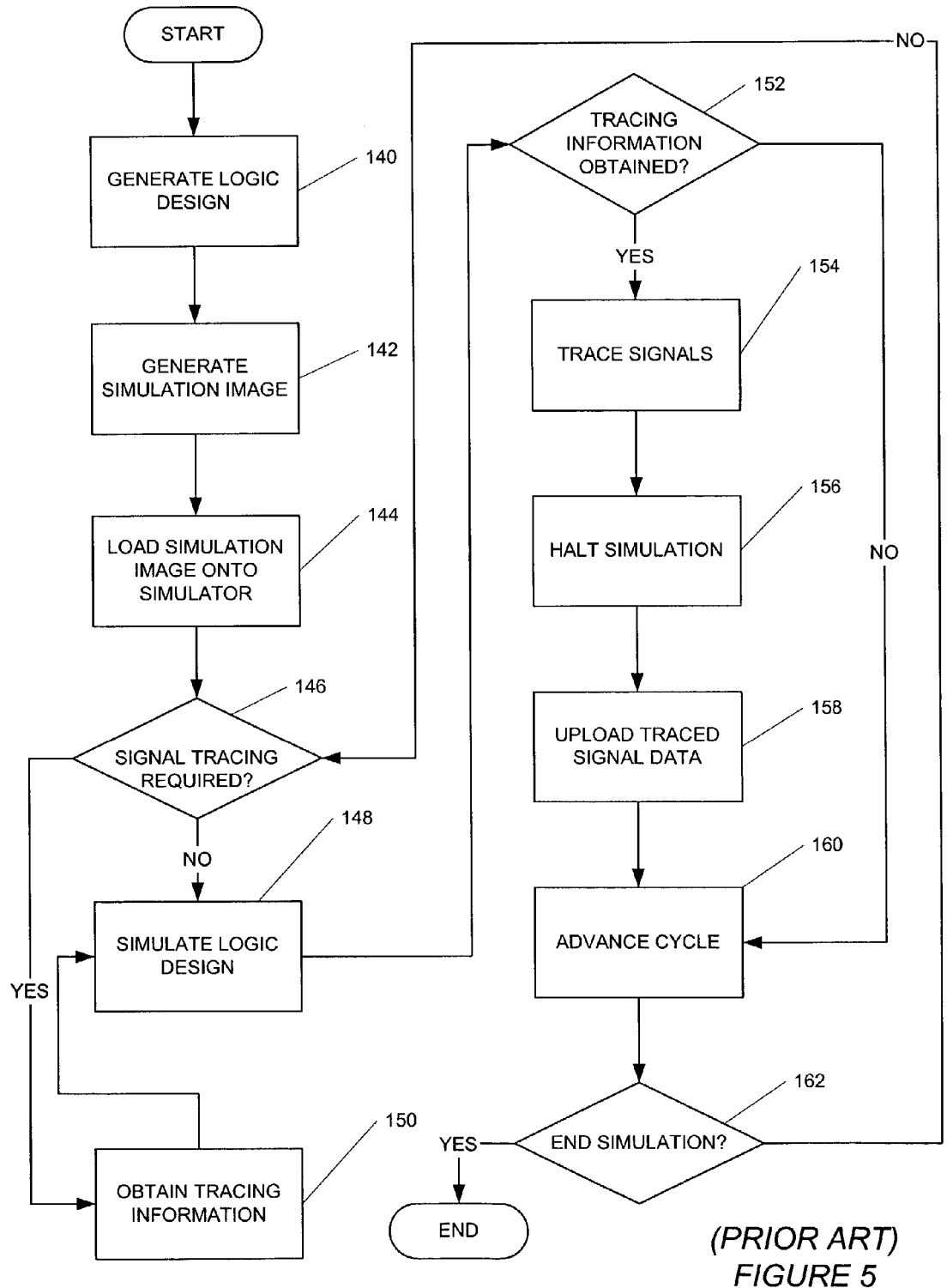
FIG. 5 shows a flowchart for single-step, cycle-based simulation using runtime tracing.

Specific embodiments of the present invention will now be described in detail with reference to the accompanying figures. Like elements in the various figures are denoted by like reference numerals for consistency.

The present invention involves a method and apparatus for tracing simulation data in hardware-accelerated environments, e.g., a cycle-based simulation system. In the following detailed description of embodiments of the present invention, numerous specific details are set forth in order to provide a more thorough understanding of the present invention. However, it will be apparent to one of ordinary skill in the art that the present invention may be practiced without these specific details. In other instances, well-known features have not been described in detail to avoid obscuring the present invention. Embodiments of the present invention may be implemented on any type of computer system or processing environment.

Before describing in further detail the method and apparatus for tracing simulation data in hardware-accelerated environments, a simulation system used with one or more embodiments of the invention is described below. In an embodiment of the invention, the simulation system may use execution processors to execute execution processor code on a general purpose computer, such as a SPARC™ workstation produced by Sun Microsystems, Inc., or on specialized hardware for performing cycle-based computations.

Those skilled in the art will appreciate that the simulation system described herein is merely an exemplary embodiment of the invention, which may be implemented on any type of computer system or programming or processing environment.

The specialized hardware is a massively parallel, multiple instruction, multiple data (MIMD), cycle-based computing system, which uses an array of execution processors arranged to perform cycle-based computations. One example of cycle-based computation is simulation of a cycle-based design written in a computer readable language, such as HDL (e.g., Verilog, etc.), or a high-level language (e.g., Occam, Modula, C, etc.).

Figure 6:
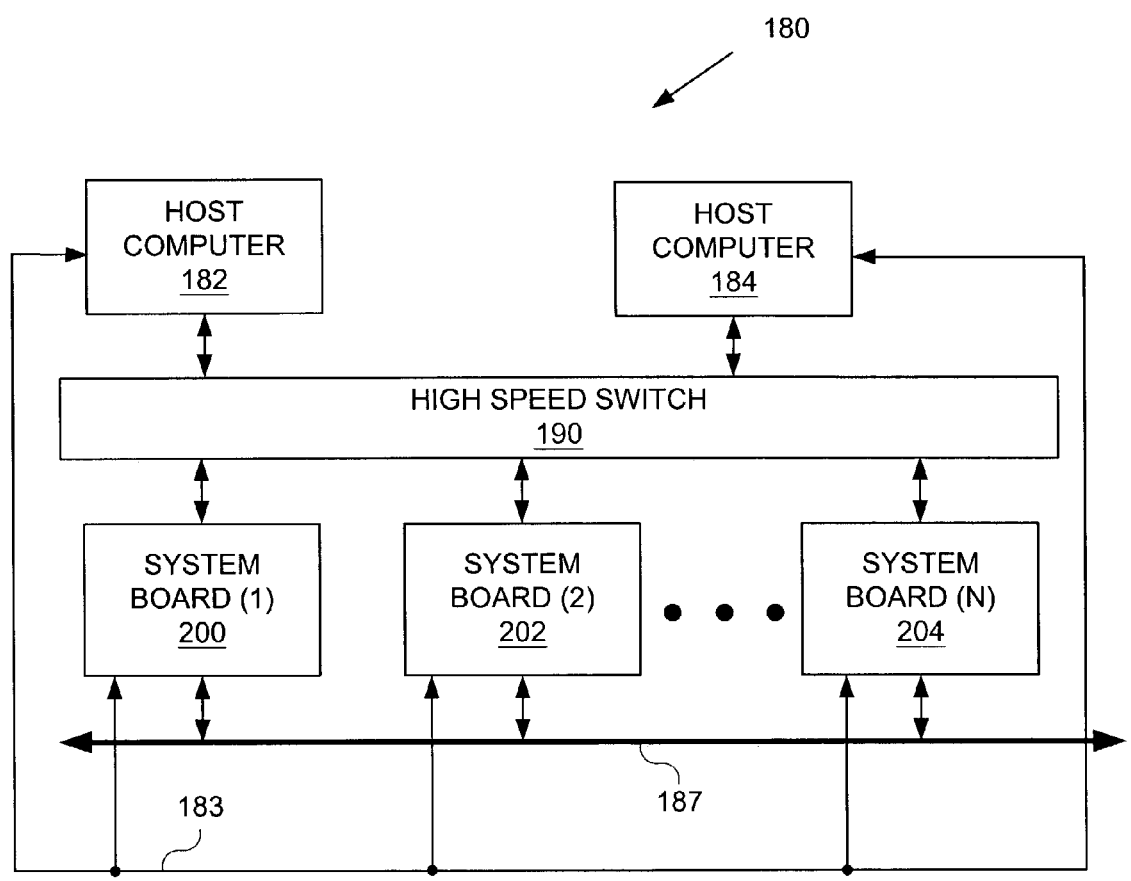
FIG. 6 shows exemplary elements of a simulation system in accordance with an embodiment of the invention.

FIG. 6 shows exemplary elements of the simulation system (180) in accordance with one or more embodiments of the invention. Cycle-based computation, such as a logic simulation on the simulation system (180), involves one or more host computers (182, 184) managing the logic simulation(s) executing on one or more system boards (200, 202, 204). Each system board contains one or more Application Specific Integrated Circuits (ASIC). Each ASIC contains multiple execution processors (not shown). The host computers (182, 184) may communicate with the system boards (200, 202, 204) using one of several pathways. The host computers (182, 184) include interface hardware and software as needed to manage a logic simulation.

A high-speed switch (190) connects the host computers (182, 184) to the system boards (200, 202, 204). The high-speed switch (190) is used for loading and retrieval of state information from execution processors located on ASICs on each of the system boards (200, 202, 204). The connection between the host computers (182, 184) and system boards (200, 202, 204) also includes an Ethernet connection (183). The Ethernet connection (183) is used for service functions, such as loading a logic design and debugging. The system also includes a backplane (187). The backplane (187) allows the ASICs on one system board to communicate with the ASICs of another system board (200, 202, 204) without having to communicate with an embedded controller located on each system board. Additional system boards may be added to the system by connecting more system boards to the backplane (187).

Figure 7:
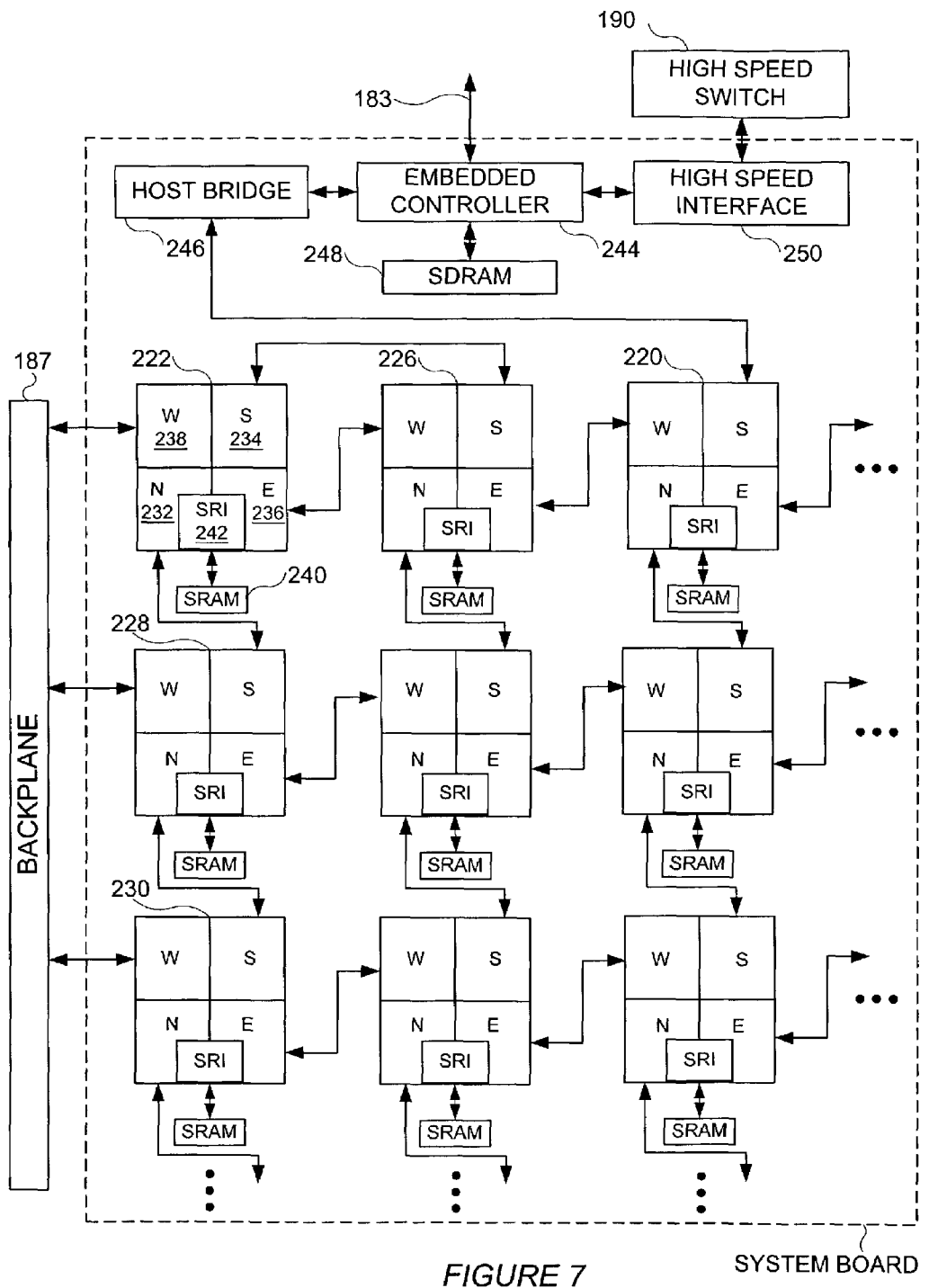
FIG. 7 shows a block diagram of a system board in accordance with an embodiment of the invention.

FIG. 7 shows a block diagram of a system board in accordance with one or more embodiments of the invention. The system board is representative of any of the system boards (e.g., system boards (200, 202, 204)) shown in FIG. 6. The system board may include multiple ASICs (e.g., 222, 226, 220, 228, 230, etc.). Each ASIC is connected via a two-dimensional mesh. Each ASIC has four input/output buffers referenced as North (N), South (S), East (E), and West (W). For example, an ASIC (222) has four input/output buffers N (232), S (234), E (236), and W (238). Each ASIC connects to other ASICs using the four input/output buffers, one for each neighboring ASIC. An edge ASIC may connect to other edge ASICs to create a secondary connection. For example, ASIC (222) and ASIC (226) connect using the E and W input/output buffers, respectively, and using their respective S input/output buffers. Another possible connection for edge ASICs is a connection to the backplane (187), which connects to other system boards. For example, ASICs (222, 228, 230) connect to the backplane, each using their respective W input/output buffers. Each ASIC may also connect to external memory in the form of static random access memory (SRAM) through an SRAM interface. For example, ASIC (222) connects to SRAM (240) through SRI (SRAM interface) (242).

One ASIC on each system board is used as an operative connection to an embedded controller. For example, ASIC (220) uses its S input/output buffer to connect to an embedded controller (244) through a host bridge (246). The embedded controller (244) connects to an Ethernet network (183), associated memory in the form of a synchronous dynamic random access memory (SDRAM) (248), and a high speed switch interface (250). The high-speed switch interface (250) connects to the high-speed switch (190). The SDRAM (248) may store instructions for the embedded controller (244). Although not shown in FIG. 7, routing processors may also be included on a system board in order to route messages between the execution processors.

Figure 8:
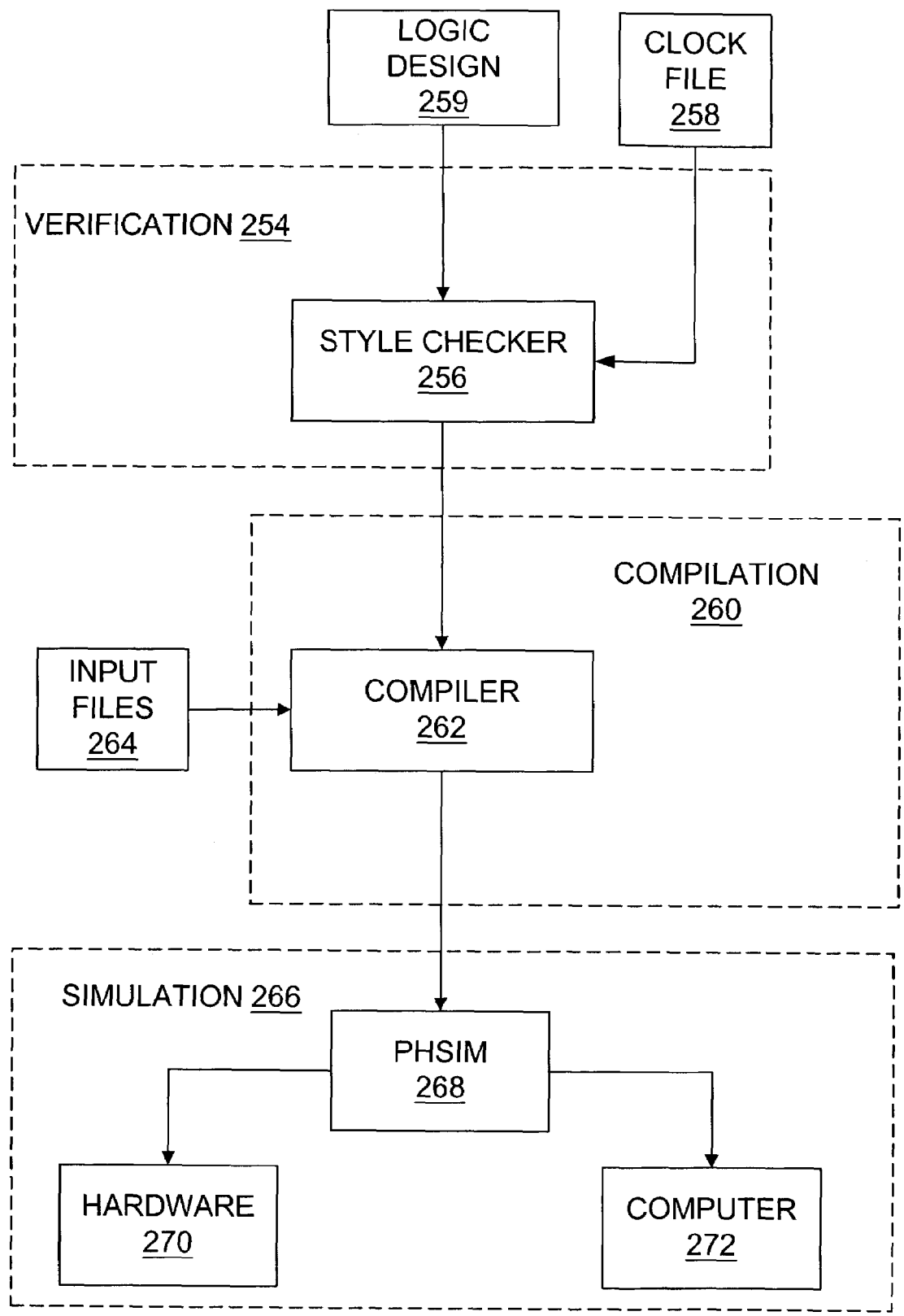
FIG. 8 shows a process for preparing a simulation of a cycle-based logic design to run on a cycle-based system in accordance with an embodiment of the invention.

In accordance with one or more embodiments of the invention, FIG. 8 shows a process of preparing a simulation of a cycle-based logic design to run on a cycle-based system. The process includes three separate phases. The first phase is a verification phase (254). This phase includes a style checker (256), which parses and checks high level design code of a logic design (259) representing the cycle-based logic design. The logic design (259) is checked for adherence to a cycle-based design standard, e.g., synchronous logic design, no combinational logic loops are included, etc. An error action during this phase results from nonconformance to the defined cycle-based design standards. A clock file input (258) defines clocks cycles for the simulation. The output of the verification phase (254) produces a verified cycle-based logic design.

The second phase is a compilation phase (260), which receives the verified cycle-based design as input from the verification phase (254). The compilation phase (260) uses a translation component, such as a compiler (262), to compile the verified cycle-based design of the verification phase (254). The compiler (262) decomposes the verified cycle-based design into execution processor code that may be executed in parallel on a processor array of the cycle-based system by one or more execution processors.

The compiler (262) also produces routing tables and other information, such as routing processor code, interface code, and an annotated symbol table. Routing tables enable static routing of messages sent during execution. Routing processors execute the routing processor code to route the messages. An annotation symbol table involves recording physical locations where the values of nets and registers have been stored, so that user interface and Programming Language Interface (PLI) routines may access values of nets and registers during runtime. Input files (264), e.g., PLI and TVI files, etc., provide functionality for items such as system task calls and trace vectors.

The compiler (262) and code generation includes a scheme for routing of messages and placement of compiled execution processor code so that there is some optimization in the choice of which of the parallel execution processors of the simulation hardware to use for certain tasks.

The third phase is the simulation phase (266), which receives input in the form of execution processor code from the compilation phase (260). A Phaser simulation system driver (268) (PHSIM) typically runs on a host computer and controls and monitors execution of simulations executing on the cycle-based system.

The host computer includes such hardware and software mechanisms as are needed to manage simulation, e.g., loading execution processor code onto a processor array.

PHSIM (268) enables user interaction with a simulation using a graphical user interface (GUI) or with a command line interface, interactive modification of simulation state, break-pointing, test vector use, system task functionality, signal tracing, single-stepping on clock cycles, and other functionalities. A simulation cycle begins with one or more simultaneous clock edges and completes when every dependent event has completed evaluation. The simulation phase (266) may run on system hardware (270), such as a hardware-accelerated environment, which is designed for cycle-based computation, or on an appropriate computer, such as a SPARC™ workstation (272) produced by Sun Microsystems, Inc.

The timing of an executing simulation is defined, in one or more embodiments of the invention, in terms of major and minor cycles. A major cycle refers to an instruction sequence that an execution processor is scheduled to execute. A minor cycle refers to each instruction that each execution processor executes at each clock cycle.

Figure 9:
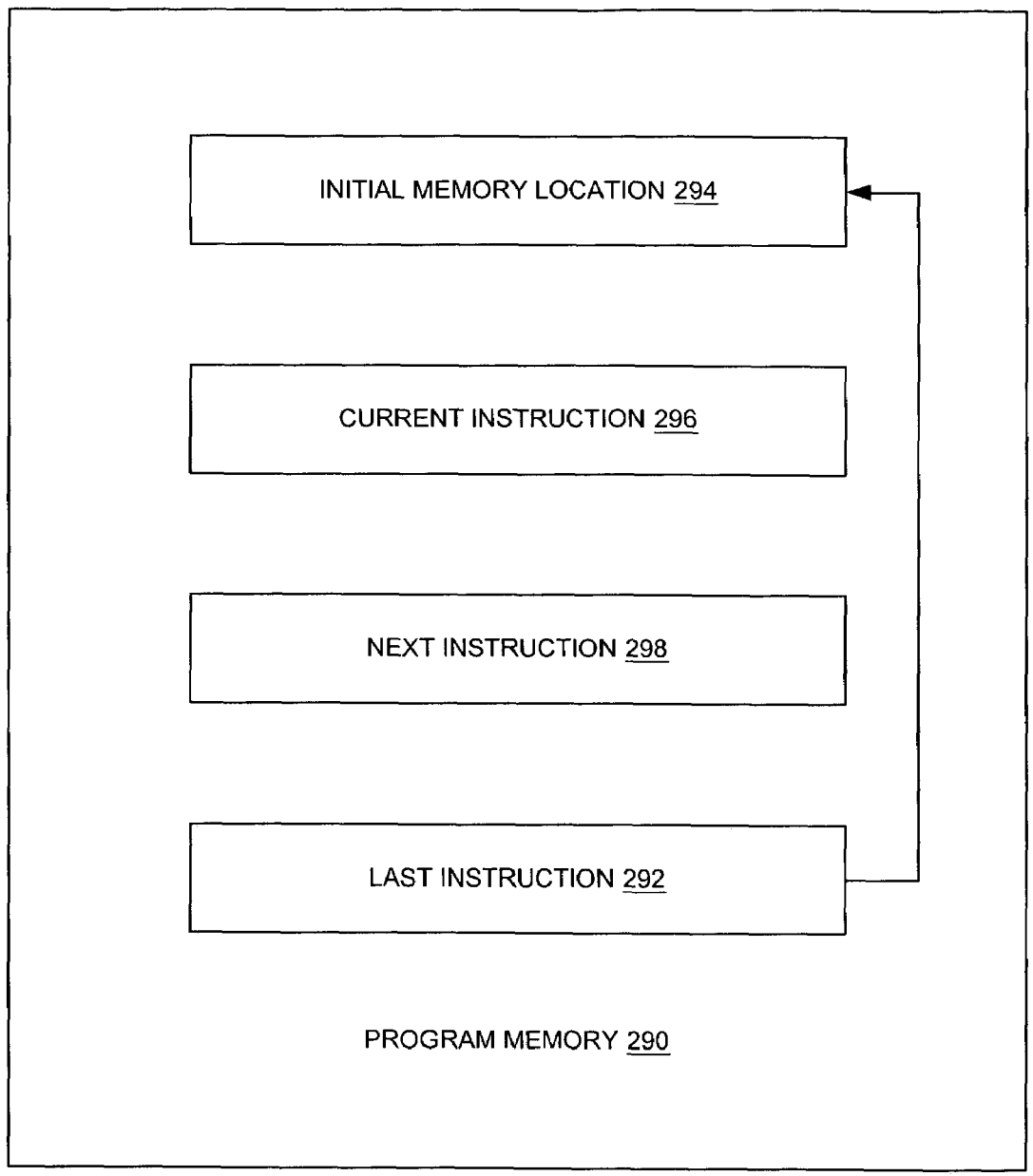
FIG. 9 shows a program memory of an execution processor that functions using major and minor cycles in accordance with an embodiment of the invention.

The program memory of an execution processor that functions using major and minor cycles is shown in accordance with one or more embodiments of the invention in FIG. 9. The execution processor executes instructions loaded into a program memory (290). The execution continues until a last instruction (292) in the program memory (290) is reached. Reaching the last instruction (292) causes the execution processor to return to an initial memory location (294). The transition from a current instruction (296) to a next instruction (298) is termed a minor cycle, and constitutes a single global execution clock cycle. Each execution processor of the simulation system typically has a similar memory and simultaneously executes one instruction in the program memory in each of the global execution clock cycles. The execution of the sequence of instructions from the initial instruction stored in the initial memory location (294), through the remaining sequence of instructions, to the last instruction (292), and back to the initial memory location (294) is termed a major cycle.

One skilled in the art will appreciate that an identical number of instructions are not required to be loaded into each execution processor's memory although the number of instructions is a pre-determined number. A final instruction may be inserted into shorter sequences to cause a particular execution processor to wait a specified number of clock cycles before returning to the initial memory location (294) and starting a new major cycle.

Figure 10:
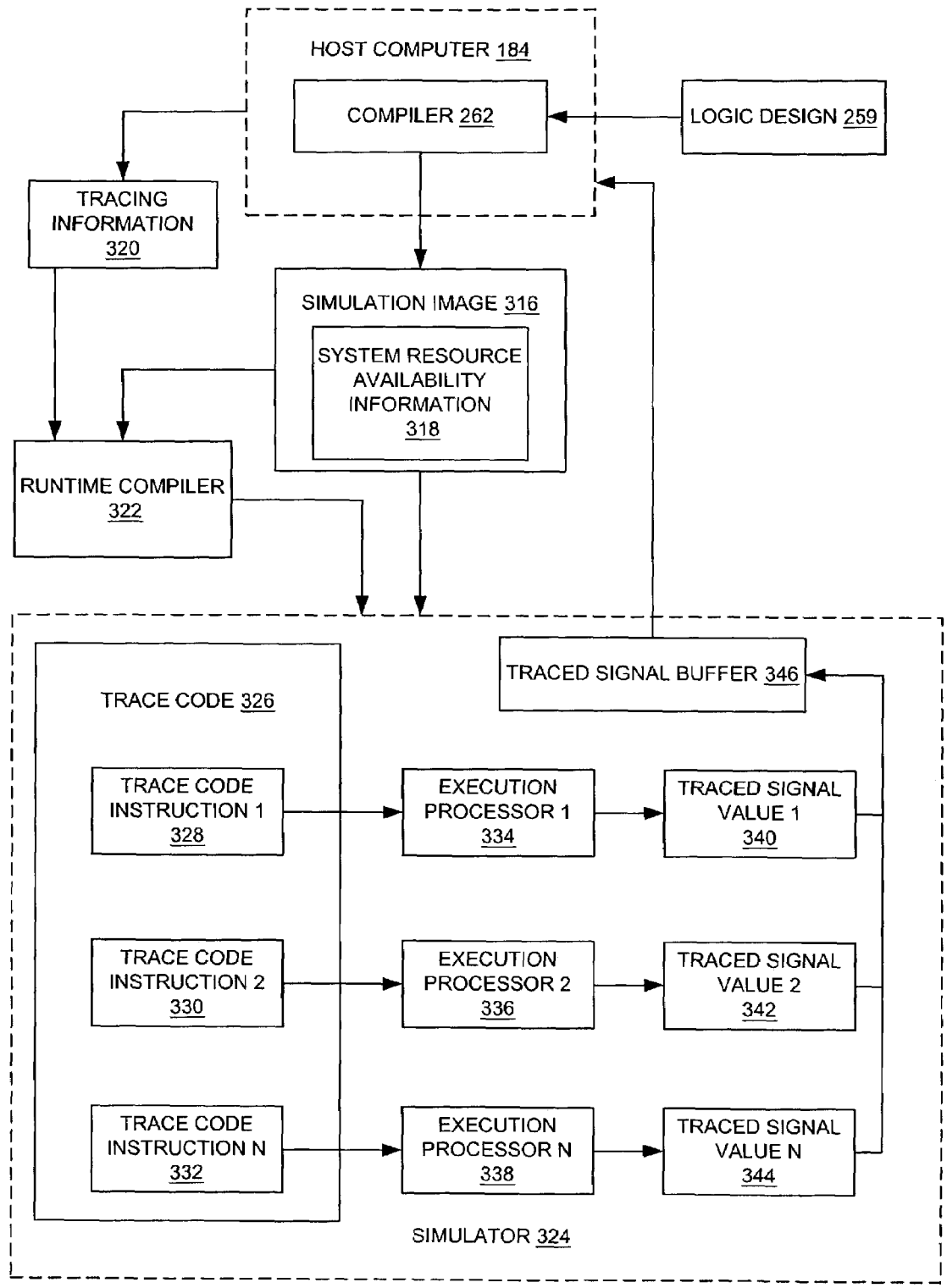
FIG. 10 shows selected components of a system for efficiently tracing simulation data in a simulator using hardware-acceleration in accordance with an embodiment of the invention.

Selected components of a system for efficiently tracing simulation data in a simulator using hardware-acceleration is shown in FIG. 10. A logic design (259) is input into the compiler (262) on a host computer (184). The compiler (262) outputs a simulation image (316), to which is appended system resource availability information (318). In accordance with an embodiment of the invention, system resources may include execution units (e.g., an execution processor and/or a routing processor), memory (e.g., SRAM), etc. The system resource availability information (318) specifies available system resources of the simulator (324). For example, if a particular execution processor is available to execute trace code during a specific cycle of the simulation, or if a particular memory address is available for storing a value of a traced signal at a particular cycle, the system resource availability information (318) includes such timing and memory address information.

The host computer (184) provides tracing information (320) into a runtime compiler (322). The tracing information (320) designates which signals of a simulation are traced, and when such signals are to be traced. The tracing information may be obtained and stored using various approaches including a static instruction-based approach, a dynamic instruction-based approach, a static table-driven approach, a dynamic table-driven approach, etc.

The static instruction-based approach generates trace code instructions during compile-time compilation depending on which logic design signals (i.e., trace net) are selected by a user. The selected trace net(s) are input as tracing information (320) to the runtime compiler (322). The dynamic instruction-based approach is identical to the static approach except trace code instructions are generated during run-time compilation.

The static table-driven approach uses a trace table (i.e., a table of logic design signals to be traced) as tracing information (320) to the runtime compiler (322) and a file containing a set of trace code instructions. In one or more embodiments of the invention, the trace table includes columns for the signals of the logic design (i.e., trace nets) selected by the user, the width (using the left-most bit and the right-most bit), and the location in the trace buffer (using an offset). The set of trace code instructions is a static file that is referenced during execution of the simulation to perform a specific trace code instruction depending on the signal being traced in the trace table. The dynamic table-driven approach is similar, however, this approach allows trace nets to be added and removed from the trace table dynamically because the simulation control program (executed on the host computer (184)) controls the population of the trace table.

In one or more embodiments of the invention, the trace code instructions of the instruction-based approach, and the table and set of instructions of the table-driven approaches are stored on system resources, e.g., SRAM, that are deemed available according to the system resource availability information (318) generated during compile-time compilation.

The runtime compiler (322) also receives input from the simulation image (316) and the system resource availability information (318). The runtime compiler (322) has access to components of the simulator (324). For example, the runtime compiler (322) may generate trace code (326), which includes trace code instructions, such as trace code instruction 1 (328), trace code instruction 2 (330), and trace code instruction N (332).

System resources of the simulator are used to perform signal tracing. As previously discussed, the system resources may include execution units and/or memory. In order to accomplish signal tracing, the runtime compiler (322) causes trace instructions to be associated with execution processors, such as execution processor 1 (334), execution processor 2 (336), and execution processor N (338). A traced signal value may be associated with a trace code instruction executed by an execution processor. For example, execution of trace code instruction 1 (328), trace code instruction 2 (330), and trace code instruction N (332) may be associated with execution processor 1 (334), execution processor 2 (336), and execution processor N (338), respectively. Further, the resulting trace code is associated with traced signal value 1 (340), traced signal value 2 (342), and traced signal value N (344). A memory location is associated with each traced signal value. The traced signal values are input into a traced signal buffer (346), which is input into the host computer (184).

Those skilled in the art will appreciate that embodiments of the invention are not limited to components shown in FIG. 10, with respect to number. For example, although three sets of associated trace code instructions, execution processors, and traced signal values are shown, the invention should not be limited to that particular number.

Figure 11A:
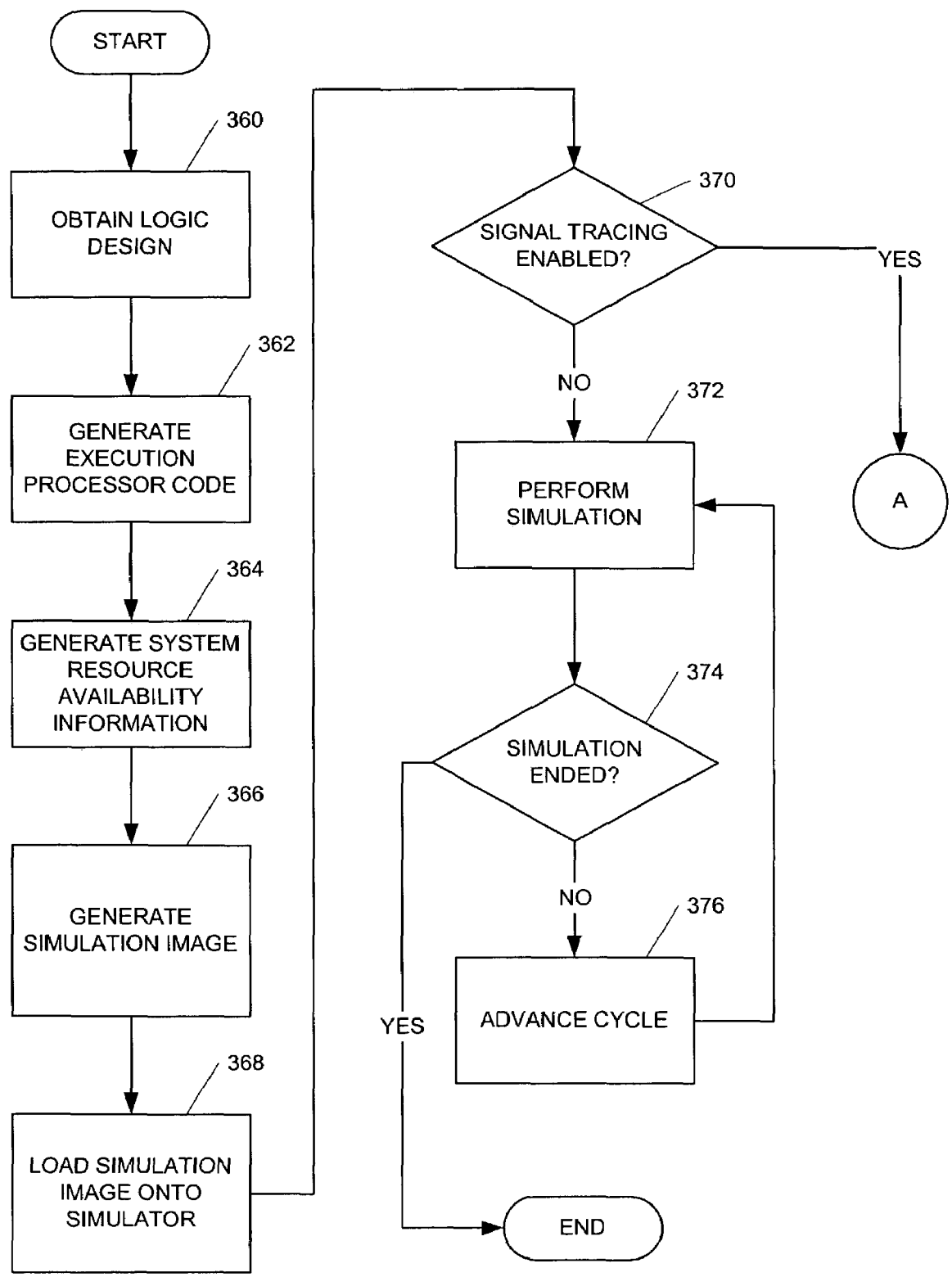
FIGS. 11A–11B show a flowchart for tracing signals in accordance with an embodiment of the invention.
Figure 11B:
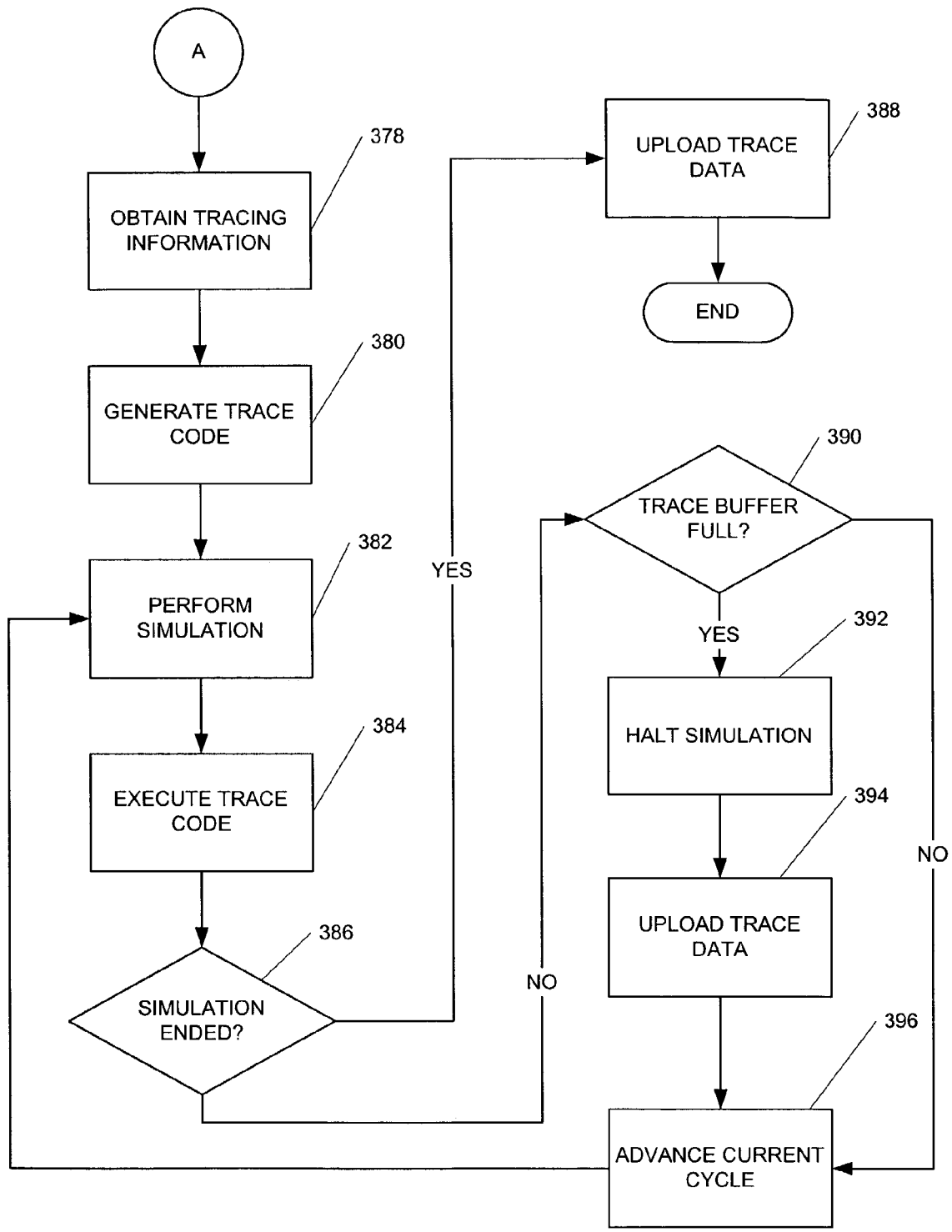

A flowchart for tracing signals on the simulator in accordance with an embodiment of the invention is shown in FIGS. 11A–11B. As shown in FIG. 11A, a first step involves obtaining the logic design (Step 360). Once the logic design has been obtained, the logic design is compiled, generating the execution processor code (Step 362). The compiler also generates other code, such as routing processor code, as detailed in FIG. 8.

The compiler generates system resources availability information by assessing the simulator for unused system resources (Step 364) and appends system resource availability information to the execution processor code, thereby generating a simulation image (Step 366). In accordance with an embodiment of the invention, the simulation image is an object file. The system resource availability information may also include system resources available with respect to routing processor system resources required for signal tracing. The simulation image is then loaded onto the simulator (Step 368). In accordance with an embodiment of the invention, loading the simulation image onto the simulation may include partitioning the object file among execution and routing processors.

A determination is then made as to whether signal tracing is enabled for the current cycle of simulation (Step 370). In accordance with an embodiment of the invention, the tracing information is used to determine whether signal tracing is enabled. If signal tracing is not enabled for the simulation cycle, the simulation is performed by execution of code of the simulation image, such as execution processor code, routing processor code, etc. (Step 372).

After the simulation is performed, a determination is made as to whether the simulation has ended (Step 374). If the simulation has not ended, the simulation cycle is advanced (Step 376), and Steps 372–376 are performed until the simulation has ended.

Otherwise, if signal tracing is enabled for the simulation cycle (as determined in Step 370), tracing information is obtained, as shown in FIG. 11B (Step 378). The tracing information designates which signals are traced, and at what times. In accordance with an embodiment of the invention, the tracing configuration file is used to store signal tracing information from the user. The tracing information may be obtained and stored using previously discussed approaches including a static instruction-based approach, a dynamic instruction-based approach, a static table-driven approach, a dynamic table-driven approach, etc.

Next, trace code is generated using the tracing information (Step 380). The runtime compiler may be used to generate the trace code or the trace code may be statically-generated and stored in a table referenced during execution of the simulation. Following the generation of the trace code, shown in FIG. 12, and described below, the simulation is performed (Step 382).

Figure 12:
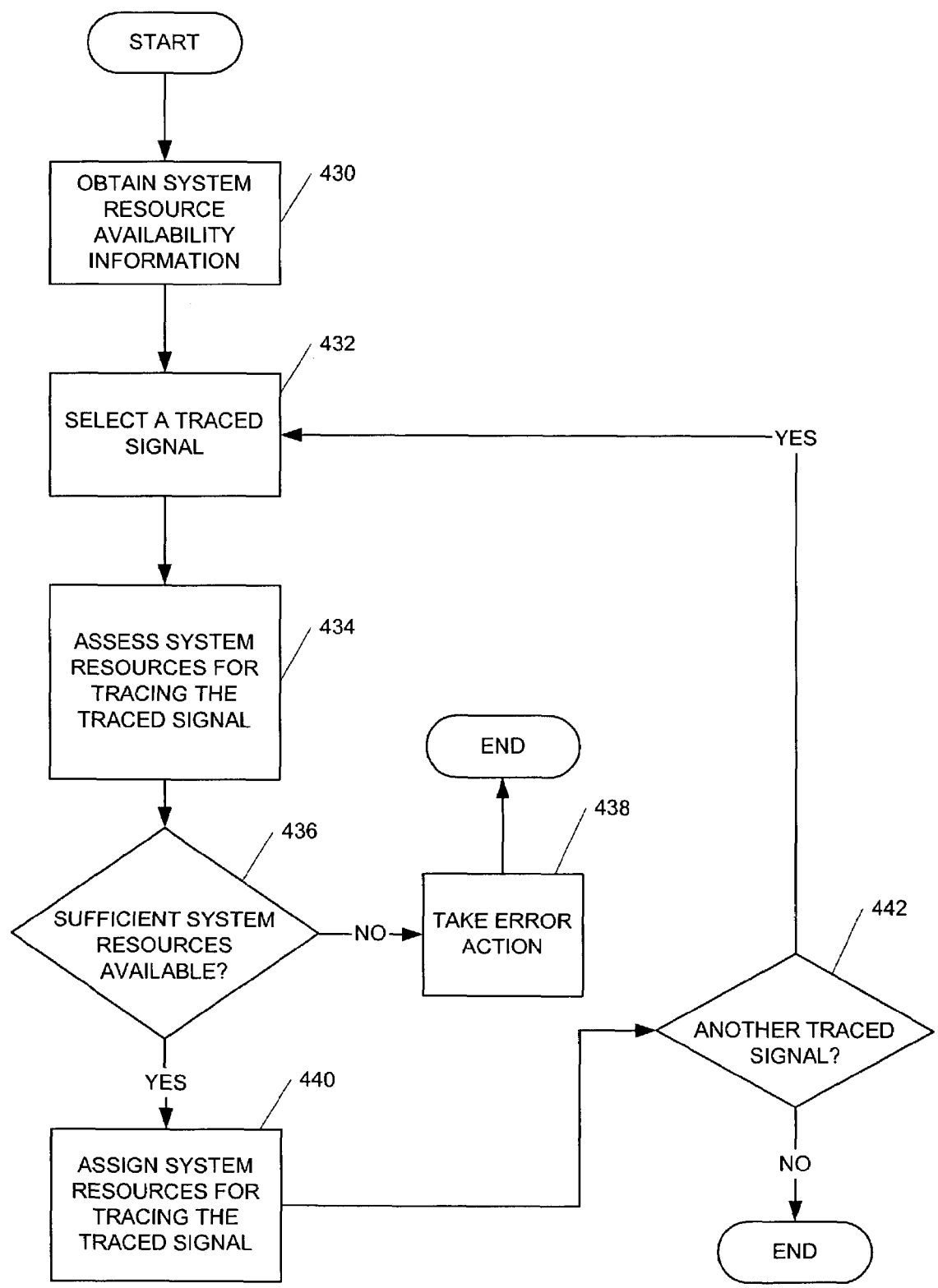
FIG. 12 shows a flowchart for generating trace code in accordance with an embodiment of the invention.

As shown in FIG. 12, a first operation for generating the trace code includes obtaining the system resources availability information from the simulation image (Step 430). Then, a traced signal is selected from the tracing information (Step 432), and an assessment is made of system resources required to trace the traced signal (Step 434). In accordance with an embodiment of the invention, the assessment includes determining whether an execution processor is available to execute trace code to read and store a value of the traced signal. The assessment may also include determining whether sufficient memory is available to store the value of the traced signal.

A determination is then made as to whether sufficient system resources are available to trace the traced signal (Step 436). The determination is made using a result of the assessment. The system resource availability information is used to determine whether sufficient system resources are available. If sufficient system resources to trace the traced signal are not available, an error action is taken (i.e., a signal is sent to the host computer) (Step 438), and the simulation ends.

Otherwise, if sufficient system resources to trace the traced signal are available, system resources are assigned to trace the traced signal (Step 440). Assigning system resources, in accordance with an embodiment of the invention, includes generating instructions to read and write values of the traced signal. For example, a read instruction may cause an execution processor to read the value of the traced signal, and a write instruction may cause the execution processor to store the value to memory.

Assigning system resources may also include inserting synchronization instructions into an instruction sequence of an execution process in order to synchronize execution of read and write instructions. The synchronization instructions may include NOP (no operation) or WAIT instructions. For example, each execution processor may execute trace code at the latest time during a simulation cycle that the routing network is available. However, other possibilities exist. For example, a particular execution processor may have time to execute the trace code in between executing the execution processor code. Assigning system resources also may include inserting a branch instruction into an instruction sequence at the end of the instruction sequence. Thus the instruction sequence loops back to the first instruction (as shown in FIG. 9) of the instruction sequence. In accordance with an embodiment of the invention, assigning system resources may include patching the object file with trace code instructions.

A determination is then made as to whether another traced signal exists (Step 442). If another traced signal exists, Steps 432–442 are performed. Otherwise, the process terminates.

Next, referring back to FIGS. 11A–11B, once the trace code is generated, the simulation is performed, as shown in FIG. 11B (Step 382). Then the trace code is executed (Step 384). Once the trace code has been executed, a determination is made as to whether the simulation has ended (Step 386). If the simulation has ended, trace data from the traced signal buffer is uploaded from the traced signal buffer to the host computer (Step 388). In accordance with an embodiment of the invention, the trace data is unformatted (i.e., raw data). Alternatively, the trace data may be formatted appropriately for appropriate tool compatibility, e.g., in .VCD file format, Debussy™ debugging tool format (Debussy is a registered trademark of Novas Software, Inc.), SignalScan™, SST, etc.

If the simulation has not ended, a determination is then made as to whether the traced signal buffer is full (Step 390). If the traced signal buffer is full, the simulation is halted (Step 392), and the trace data is uploaded to the host computer from the traced signal buffer (Step 394). In accordance with an embodiment of the invention, the simulation is halted by initiating execution of a PLI routine. The PLI routine is initiated via a feedback network from the simulator to the host computer. In accordance with an embodiment of the invention, instructions for initiating the PLI routine are "hard-coded" into memory of the simulation. Thus, the simulation image does not require alteration or "patching" of previously written memory for use of the PLI routine.

After uploading the trace data, or if the traced signal buffer is not full, the simulation cycle is then advanced (Step 396), and Steps 382–396 are performed until the simulation has ended. In accordance with an embodiment of the invention, signal tracing for a simulation may be disabled by removing trace code instructions written to instruction sequences, and re-inserting overwritten branching instructions into the instruction sequences. Further, disabling signal tracing may be reversed for the simulation by repeating steps for generating the trace code as shown in FIG. 12.

Advantages of various embodiments of the invention may include one or more of the following. In one or more embodiments, the invention facilitates signal tracing during simulation without halting the simulation after each major cycle. In accordance with an embodiment of the invention, the simulation is halted only when the data from the traced signal buffer requires uploading because the traced signal buffer is full, or when the simulation is complete. Further, the invention provides for generation of a simulation image before tracing information is required, thus enhancing flexibility of simulation. Furthermore, because the tracing information is not included as part of the simulation image, the simulation image size does include the traced signal information.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for tracing signals in a cycle-based simulation, comprising:
   a plurality of resources comprising at least one selected from a group consisting of an execution processor and a routing processor;
   a compiler configured to:
      determine an availability of each of the plurality of resources during a cycle of the cycle-based simulation; and
      generate a simulation image using the availability and a logic design;
   a tracing information comprising a signal in the simulation image to be traced; and
   a runtime compiler configured to:
      generate a block of trace code using the tracing information; and
      assign the block of trace code to at least one of the plurality of resources to trace the signal, wherein the block of trace code is assigned based on the availability.

2. The system of claim 1, further comprising:
a traced signal buffer configured to store a value generated by execution of the simulation image.

3. The system of claim 2, wherein the value is generated during a first simulation cycle.

4. The system of claim 3, wherein the traced signal buffer is configured to store the value during the first simulation cycle and during a second simulation cycle before uploading the value.

5. The system of claim 1, wherein the simulation image is an object file.

6. The system of claim 1, wherein the tracing information is generated using at least one selected from a group consisting of a static instruction-based approach, a dynamic instruction-based approach, a static table-driven approach, and a dynamic table-driven approach.

7. A method of tracing signals for a cycle-based simulation, comprising:
   determining an availability of a plurality of resources during a cycle of the cycle-based simulation;
   generating a simulation image using the availability and a logic design;
   obtaining a tracing information comprising a signal to be traced;
   generating a block of trace code using the tracing information;
   assigning the block of trace code to one of the plurality of resources based on the availability;
   performing a first simulation cycle of the cycle-based simulation to generate a first value of the signal; and
   tracing the signal using the first value and the one of the plurality of resources.

8. The method of claim 7, wherein the tracing information is generated using at least one selected from a group consisting of a static instruction-based approach, a dynamic instruction-based approach, a static table-driven approach, and a dynamic table-driven approach.

9. The method of claim 7, further comprising:
   storing the first value in a traced signal buffer; and
   advancing to a second simulation cycle of the cycle-based simulation.

10. The method of claim 9, further comprising:
    performing the second simulation cycle to generate a second value of the signal;
    storing the second value in the traced signal buffer; and
    uploading the first value and the second value from the signal buffer, wherein the advancing to the second simulation cycle occurs before the first value is uploaded.

11. The method of claim 10, wherein the first value and the second value are uploaded when the traced signal buffer is full.

12. The method of claim 7, wherein the one of the plurality of resources is an execution processor.

13. The method of claim 12, further comprising:
    inserting a synchronization instruction into an instruction sequence of the execution processor; and
    inserting a loop back instruction into the instruction sequence.

14. A computer system for tracing signals in a cycle-based simulation, comprising:
    a processor;
    a memory;
    a storage device; and
    software instructions stored in the memory for enabling the computer system to:
       determine an availability of a plurality of resources during a cycle of the cycle-based simulation;
       generate a simulation image using the availability and a logic design;
       obtain a tracing information comprising a signal to be traced;
       generate a block of trace code using the tracing information;
       assign the block of trace code to one of the plurality of resources based on the availability;
       perform a first simulation cycle of the cycle-based simulation to generate a first value of the signal; and
       trace the signal using the first value and the one of the plurality of resources.

15. The computer system of claim 14, wherein the tracing information is generated using a least one selected from a group consisting of a static instruction-based approach, a dynamic instruction-based approach, a static table-driven approach, and a dynamic table-driven approach.

16. The computer system of claim 14, further comprising software instructions to:
store the first value in a traced signal buffer; and
advance to a second simulation cycle of the cycle-based simulation.

17. The computer system of claim 16, further comprising software instructions to:
perform the second simulation cycle to generate a second value of the traced signal;
store the second value in the traced signal buffer; and
upload the first value and the second value from the traced signal buffer, wherein the advance to the second simulation cycle occurs before the first value is uploaded.

18. The computer system of claim 17, wherein the first value and the second value are uploaded when the traced signal buffer is full.

19. The computer system of claim 14, wherein the one of the plurality of resources is an execution processor.

20. The computer system of claim 19, further comprising software instructions to:
insert a synchronization instruction into an instruction sequence of the execution processor; and
insert a loop back instruction into the instruction sequence.

21. An apparatus for tracing signals in a cycle-based simulation, comprising:
means for determining an availability of a plurality of resources during a cycle of the cycle-based simulation;
means for generating a simulation image using the availability and a logic design;
means for obtaining a tracing information comprising a signal to be traced;
means for generating a block of trace code using the tracing information;
means for assigning the block of trace code to one of the plurality of resources based on the availability;
means for performing a first simulation cycle of the cycle-based simulation to generate a first value of the signal; and
means for tracing the signal using the first value and the one of the plurality of resources.

* * * * *